US010304819B2

(12) United States Patent
Kim et al.

(10) Patent No.: US 10,304,819 B2
(45) Date of Patent: May 28, 2019

(54) SEMICONDUCTOR DEVICE WITH MULTIGATE TRANSISTOR STRUCTURE

(71) Applicant: Samsung Electronics Co., Ltd., Suwon-si, Gyeonggi-do (KR)

(72) Inventors: Hyo Jin Kim, Bucheon-si (KR); Kwan Young Chun, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/838,840

(22) Filed: Dec. 12, 2017

(65) Prior Publication Data

US 2018/0358346 A1    Dec. 13, 2018

(30) Foreign Application Priority Data

Jun. 9, 2017  (KR) .......................... 10-2017-0072391

(51) Int. Cl.
| | |
|---|---|
| *H01L 27/02* | (2006.01) |
| *H01L 29/66* | (2006.01) |
| *H01L 27/088* | (2006.01) |
| *H01L 29/423* | (2006.01) |
| *H01L 29/06* | (2006.01) |
| *H01L 21/8234* | (2006.01) |

(52) U.S. Cl.
CPC ...... *H01L 27/0207* (2013.01); *H01L 27/0886* (2013.01); *H01L 29/0673* (2013.01); *H01L 29/42392* (2013.01); *H01L 29/6681* (2013.01); *H01L 21/823431* (2013.01); *H01L 21/823437* (2013.01)

(58) Field of Classification Search
CPC ............ H01L 27/0207; H01L 27/0886; H01L 29/0673; H01L 29/42392; H01L 29/6681; H01L 21/823431; H01L 21/823437
See application file for complete search history.

(56) References Cited

U.S. PATENT DOCUMENTS

| | | |
|---|---|---|
| 9,105,467 B2 | 8/2015 | Lee et al. |
| 9,460,259 B2 | 10/2016 | Baek et al. |
| 9,490,263 B2 | 11/2016 | Jeon et al. |

(Continued)

*Primary Examiner* — Sitaramarao S Yechuri
(74) *Attorney, Agent, or Firm* — Muir Patent Law, PLLC

(57) ABSTRACT

A semiconductor device includes a cell region that includes a first active region and a second active region extending in a first direction and a separation region between the first active region and the second active region. The cell region has a first width. A first gate structure and a second gate structure are disposed on the cell region, are spaced apart from each other in the first direction, and extend in the second direction. A first metal line and a second metal line are disposed on the cell region, extend in the first direction, and are spaced apart from each other by a first pitch. Each of the first and second metal lines has a second width. A first gate contact electrically connects the first gate structure and the first metal line. At least a portion of the first gate contact overlaps the separation region. A second gate contact electrically connects the second gate structure and the second metal line. At least a portion of the second gate contact overlaps the separation region. The first width divided by a sum of the first pitch and the second width is six or less.

19 Claims, 12 Drawing Sheets

(56) References Cited

U.S. PATENT DOCUMENTS

| | | | |
|---|---|---|---|
| 2004/0198007 A1* | 10/2004 | Song | H01L 21/28518 438/300 |
| 2013/0043592 A1* | 2/2013 | Park | H01L 29/4966 257/754 |
| 2013/0270648 A1* | 10/2013 | Manabe | H01L 27/092 257/369 |
| 2014/0103403 A1* | 4/2014 | Kim | H01L 21/76801 257/288 |
| 2016/0028347 A1* | 1/2016 | Okamoto | H03B 5/24 331/108 R |
| 2016/0079354 A1 | 3/2016 | Park et al. | |
| 2016/0276331 A1* | 9/2016 | Liaw | H01L 27/1124 |
| 2016/0307837 A1* | 10/2016 | Park | H01L 27/088 |
| 2017/0033102 A1 | 2/2017 | Kim et al. | |
| 2017/0053828 A1* | 2/2017 | Park | H01L 21/76897 |
| 2017/0053917 A1 | 2/2017 | Azmat et al. | |

\* cited by examiner

SEMICONDUCTOR DEVICE WITH MULTIGATE TRANSISTOR STRUCTURE

CROSS REFERENCE TO RELATED APPLICATION

This application claims the benefit of Korean Patent Application No. 10-2017-0072391, filed on Jun. 9, 2017, in the Korean Intellectual Property Office, the disclosure of which is incorporated herein by reference in its entirety.

BACKGROUND

1. Technical Field

The present disclosure relates to semiconductor devices.

2. Description of the Related Art

For semiconductor device density enhancement, the multigate transistor has been suggested as one of the scaling technologies, according to which a multi-channel active pattern (or silicon body) in a fin or nanowire shape is formed on a substrate, with gates then being formed on a surface of the multi-channel active pattern.

Such multigate transistor allows easy scaling, as it uses a three-dimensional channel. Furthermore, current control capability can be enhanced without requiring increased gate length of the multigate transistor. Such structures can effectively inhibit a short channel effect (SCE) wherein the electric potential of a channel region is affected by a drain voltage.

SUMMARY

Exemplary embodiments of the present disclosure may solve the problems of the related art. Exemplary embodiments may provide a semiconductor device structure capable of reducing the level of difficulty of the process for separating a gate contact and a source/drain contact in a cell region defined by a correlation between the width of a cell region, a pitch between metal lines and a width of the metal lines.

Some embodiments provide a semiconductor device including a cell region that includes a first active region and a second active region extending in a first direction and a separation region formed between the first active region and the second active region. The cell region has a first width in a second direction perpendicular to the first direction. A first gate structure and a second gate structure are disposed on the cell region, are spaced apart from each other in the first direction, and extend in the second direction. A first metal line and a second metal line are disposed on the cell region, extend in the first direction, and are spaced apart from each other by a first pitch in the second direction. Each of the first and second metal lines has a second width in the second direction. A first gate contact electrically connects the first gate structure and the first metal line. At least a portion of the first gate contact overlapping the separation region. A second gate contact electrically connects the second gate structure and the second metal line. At least a portion of the second gate contact overlaps the separation region. The first width divided by a sum of the first pitch and the second width is six or less.

Further embodiments provide a semiconductor device including a cell region that includes a first active region, a second active region and a separation region between the first active region and the second active region. A plurality of metal lines is disposed on the cell region, the metal lines extending in a first direction and spaced apart from one another in a second direction perpendicular to the first direction. A gate structure is disposed transverse to the plurality of metal lines and extends in the second direction. A gate contact at least partially overlaps the separation region and electrically connects at least one metal line of the plurality of metal lines and the gate structure. A number of the plurality of metal lines spaced apart from one another in the second direction on the first active region, the separation region and the second active region is three or four.

Still further embodiments provide a semiconductor device including a cell region that includes a first active region and a second active region extending in a first direction and a separation region formed between the first active region and the second active region, the cell region having a first width in a second direction perpendicular to the first direction. A first gate structure and a second gate structure are disposed on the cell region, are spaced apart from each other in the first direction, and extend in the second direction. A first metal line overlaps the first active region, extends in the first direction, and has a second width in the second direction. Aa second metal line at least partially overlaps the separation region, is spaced apart from the first metal line by a first pitch in the second direction, and extends in the first direction. A third metal line at least partially overlaps the separation region, is spaced apart from the second metal line by a second pitch in the second direction, and extends in the first direction. A fourth metal line overlaps the second active region, is spaced apart from the third metal line by a third pitch in the second direction, and extends in the first direction. A first gate contact electrically connects the first gate structure and the second metal line. A second gate contact electrically connects the second gate structure and the third metal line. The first, second and third pitches are substantially the same and the first width divided by a sum of the first pitch and the second width is six or less.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings.

DETAILED DESCRIPTION

Hereinbelow, a semiconductor device according some embodiments of the present disclosure will be described with reference to FIG. 1 to FIG. 6.

Figure 1:
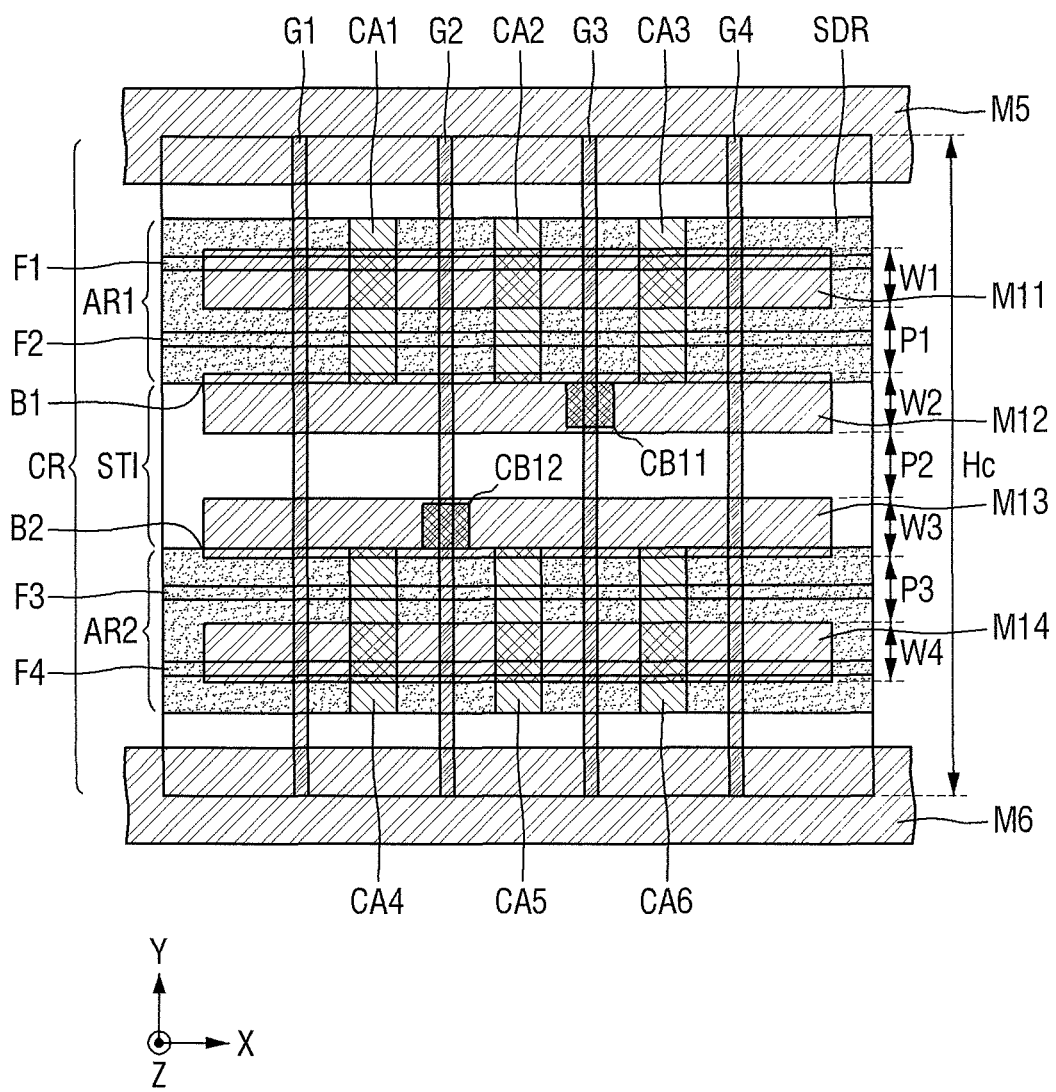
FIG. 1 is a layout diagram of a semiconductor device according to some embodiments.
Figure 2:
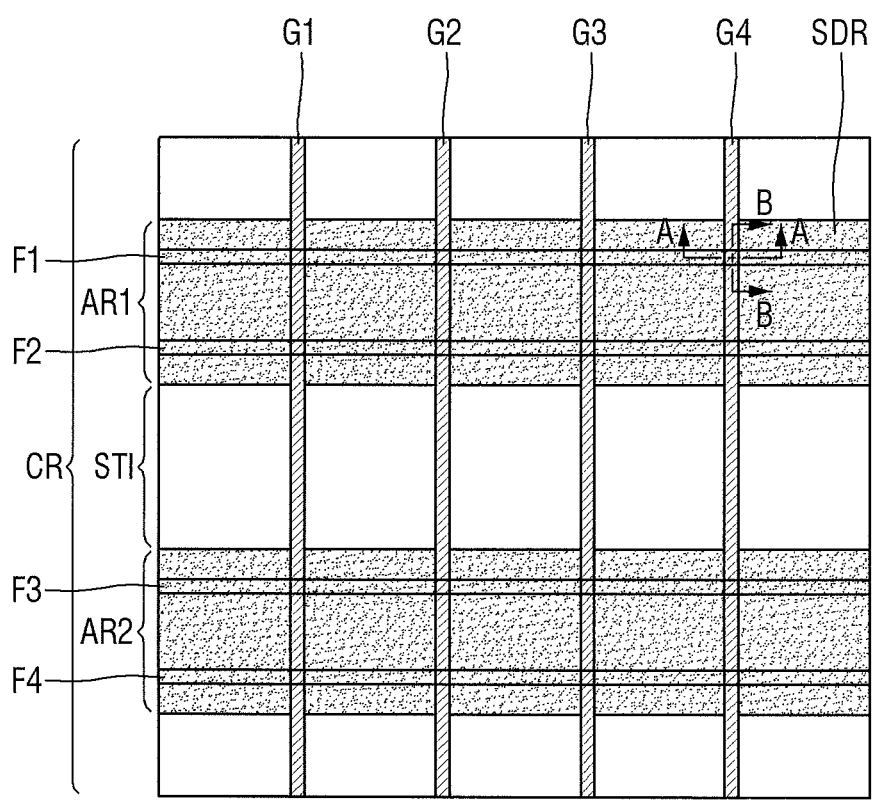
FIG. 2 is a layout diagram illustrating a layout of a first level step of the layout diagram of FIG. 1.
Figure 2:
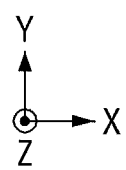
Figure 3:
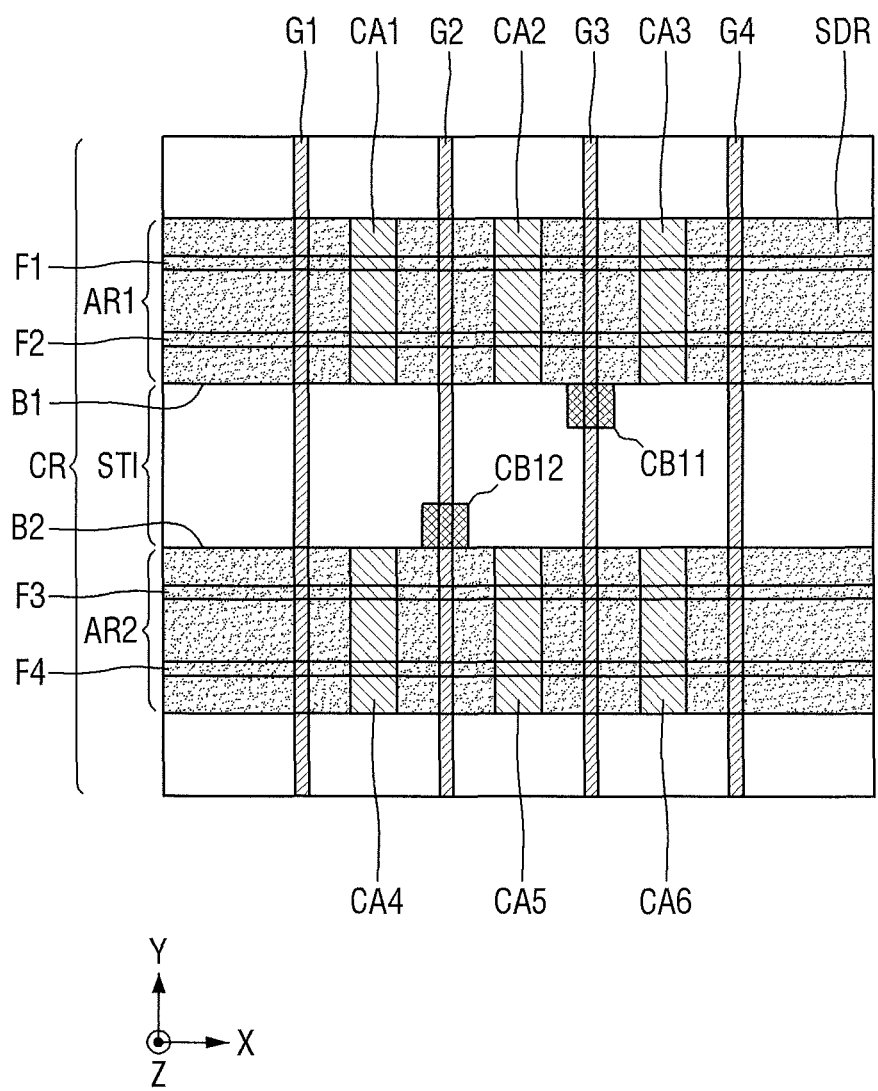
FIG. 3 is a layout diagram illustrating a layout of first and second level steps of the layout diagram of FIG. 1.
Figure 4:
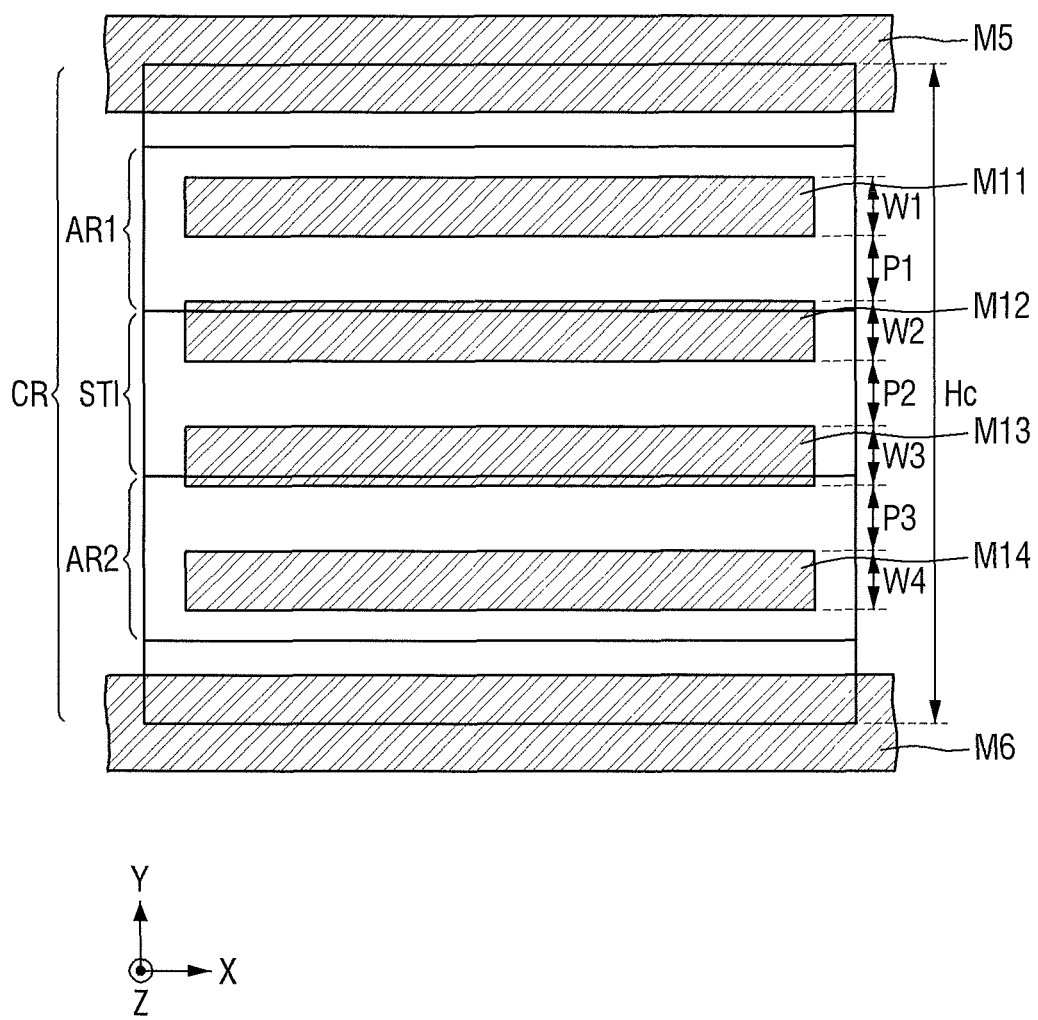
FIG. 4 is a layout diagram illustrating a layout of a third level step of the layout diagram of FIG. 1.
Figure 5:
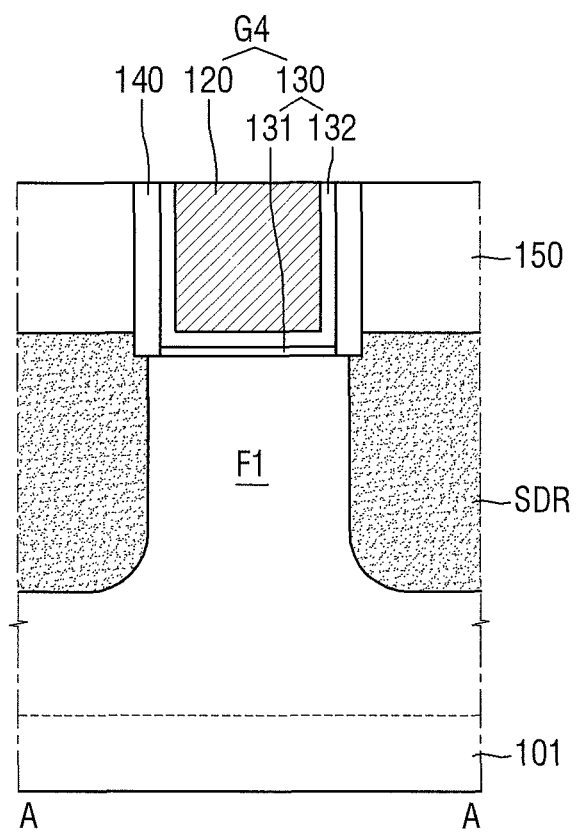
FIG. 5 is a cross-sectional view taken on line A-A of FIG. 2.
Figure 6:
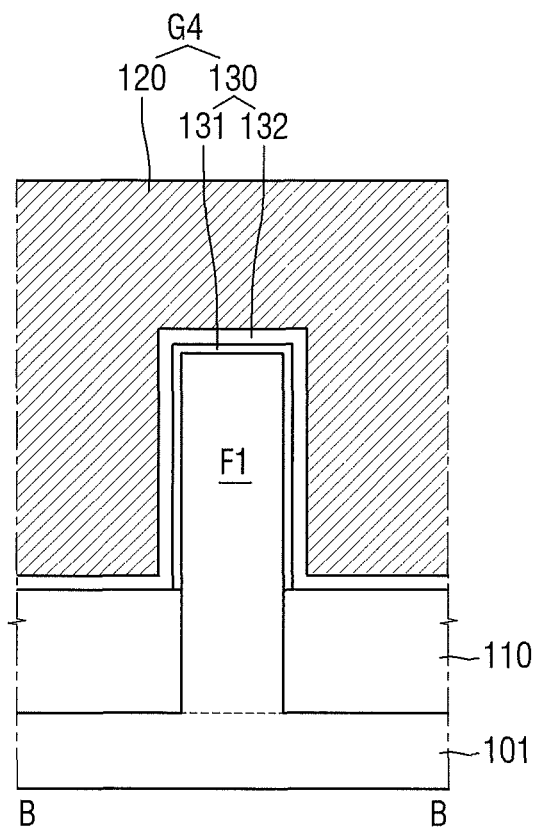
FIG. 6 is a cross-sectional view taken on line B-B of FIG. 2.

FIG. 1 is a layout diagram of a semiconductor device according to some embodiments of the present disclosure. FIG. 2 is a layout diagram illustrating a layout of a first level step of the layout diagram of FIG. 1. FIG. 3 is a layout diagram illustrating a layout of first and second level steps of the layout diagram of FIG. 1. FIG. 4 is a layout diagram illustrating a layout of a third level step of the layout diagram of FIG. 1. FIG. 5 is a cross-sectional view taken on line A-A of FIG. 2. FIG. 6 is a cross-sectional view taken on line B-B of FIG. 2.

Referring to FIG. 1 to FIG. 6, a semiconductor device according to some embodiments of the present disclosure includes a cell region CR, a first active region AR1, a second active region AR2, a separation region ST1, first, second, third and fourth gate structures G1, G2, G3, G4, first, second, third and fourth fin-type patterns F1, F2, F3, F4, first, second, third and fourth metal lines M11, M12, M13, M14, a fifth metal line M5, a sixth metal line M6, a first gate contact CB11, a second gate contact CB12, a source/drain region SDR, and first, second, third, fourth, fifth and sixth source/drain contacts CA1, CA2, CA3, CA4, CA5, CA6.

The cell region CR may include the first action region AR1, the second active region AR2 and the separation region STI. Specifically, the cell region CR may include a first power rail region, the first active region AR1 adjacent to the first power rail region in a second direction Y, the separation region STI adjacent to the first active region AR1 in the second direction Y, the second active region AR2 adjacent to the separation region STI in the second direction Y, and a second power rail region adjacent to the second active region AR2 in the second direction.

In this case, the first power rail region, the first active region AR1, the separation region STI, the second active region AR2 and the second power rail region may each be formed so as to extend in a first direction X.

The cell region CR may represent one cell. The cell region CR has a first width Hc in the second direction Y.

In each of the first power rail region, the second power rail region and the separation region STI, a dummy fin-type pattern that extends in the first direction may be disposed. As used herein "dummy fin-type pattern" means a fin-type pattern that is not actively used. However, for convenience of explanation, in the FIG. 1 to FIG. 3, the dummy fin-type patterns are not shown.

The first power rail region and the second power rail region may serve to supply power to an entirety of the cell region CR. For example, the first power rail region may supply positive voltage, and the second power rail region may supply negative voltage. However, embodiments are not limited thereto.

The first active region AR1 may include a first fin-type pattern F1 and a second fin-type pattern F2, each of which extends in the first direction X and protrudes from a substrate (101 of FIG. 5) in a third direction Z. The first fin-type pattern F1 may be spaced apart from the second fin-type pattern F2 in the second direction Y.

The second active region AR2 may include a third fin-type pattern F3 and a fourth fin-type pattern F4, that each extends in the first direction X and is protrudes from the substrate (101 of FIG. 5) in the third direction Z. The third fin-type pattern F3 may be spaced apart from the fourth fin-type pattern F4 in the second direction Y.

The first, second, third and fourth gate structures G1, G2, G3, G4 may be spaced apart from one another in the first direction X on the cell region CR, and may each extend in the second direction Y. The first, second, third and fourth gate structures G1, G2, G3, G4 may be disposed on the first, second, third and fourth fin-type patterns F1, F2, F3, F4 so as to intersect each of the first, second, third and fourth fin-type patterns F1, F2, F3, F4. Referring to FIG. 5 and FIG. 6, for example, the fourth gate structure G4 may be disposed on the first fin-type pattern F1 that extends in the first direction X and that protrudes from the substrate 101, such that the fourth gate structure G4 intersects the first fin-type pattern F1.

The substrate 101 may be, for example, a bulk silicon or a silicon-on-insulator (SOI). In some embodiments, the substrate 101 may be a silicon substrate, or may include other materials, such as silicon germanium, indium antimonide, lead telluride compound, indium arsenide, indium phosphide, gallium arsenide, or gallium antimonide. In some embodiments, the substrate 101 may be a base substrate having an epitaxial layer formed thereon.

The fourth gate structure G4 may include a gate insulating film 130 and a gate electrode 120. A gate spacer 140 may be disposed on both side walls of the fourth gate electrode G4 extending in the second direction Y.

The gate insulating film 130 may be disposed between the first fin-type pattern F1 and the gate electrode 120. The gate insulating film 130 may be disposed on an upper surface and a side surface of the first fin-type pattern F1, as illustrated in FIG. 6. The gate insulating film 130 may be disposed between the gate electrode 120 and a field insulating film 110.

For example, the gate insulating film 130 may include an interfacial film 131 and a high-k dielectric insulating film 132, as illustrated in FIG. 5 and FIG. 6. However, embodiments are not limited thereto. For example, in some embodiments, the interfacial film 131 may be omitted.

The interfacial film 131 may be disposed on the upper surface and the side surface of the first fin-type pattern F1, as illustrated in FIG. 6. The interfacial film 131 may not be disposed along a side wall of the gate spacer 140. The interfacial film 131 may include, for example, a silicon oxide film. However, embodiments are not limited thereto.

The high-k dielectric insulating film 132 may be disposed between the gate electrode 120 and the interfacial film 131. The high-k dielectric insulating film 132 may be disposed between the gate spacer 140 and the gate electrode 120. The high-k dielectric insulating film 132 may be disposed along the side wall of the gate spacer 140.

The high-k dielectric insulating film 132 may include a high-k dielectric material having a higher dielectric constant than the silicon oxide film. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, Aluminum oxide, lead scandium tantalum oxide, and lead zinc niobate. However, embodiments are not limited thereto. When the interfacial film 131 is omitted as described above, the high-k dielectric insulating film 132 may include not only the high-k dielectric material described above, but also a silicon oxide film, a silicon oxynitride film, or a silicon nitride film, or the like.

The gate electrode 120 may be disposed on the high-k dielectric insulating film 132. The gate electrode 120 may include a metal, for example, at least one of W, Al and TiN. However, embodiments are not limited thereto. In some embodiments, the gate electrode 120 may include not metal, but instead a semiconductor such as Si, SiGe or the like.

The source/drain region SDR may be disposed on both sides of the fourth gate structure G4. The source/drain region SDR may be disposed within the first fin-type pattern F1. The first fin-type pattern F1 may be partially etched, and then the source/drain region SDR may be formed in the portion where the first fin-type pattern F1 has been etched. The source/drain region SDR may be an elevated source/drain region. Therefore, an upper surface of the source/drain region SDR may be higher than the upper surface of the first fin-type pattern F1.

When the semiconductor device is a PMOS transistor, the source/drain region SDR may include a compressive stress material. For example, the compressive stress material may be a material that has a greater lattice constant than Si, such as SiGe. The compressive stress material may exert a compressive stress on the first fin-type pattern F1 under the fourth gate structure G4, i.e., on the channel region, and thus enhance mobility of carriers in the channel region.

When the semiconductor device is a NMOS transistor, the source/drain region SDR may include a same material as the substrate 101, or a tensile stress material. For example, when the substrate 101 is Si, the source/drain region SDR may be Si. However, in some embodiments, the source/drain region SDR may be a material that has a smaller lattice constant than Si, such as SiC or SiP. The source/drain region SDR may be formed by epitaxial growth.

Although not illustrated in FIG. 5 and FIG. 6, a silicide film may be disposed on the source/drain region SDR. The silicide film may be formed along the upper surface of the source/drain region SDR. The silicide film may serve to reduce surface resistance, contact resistance, or the like when the source/drain region SDR is contacting the source/drain contact, and may include a conductive material, such as Pt, Ni, Co, or the like. In some embodiments, the semiconductor device may not include the silicide film.

An interlayer insulating film 150 may overlie a side surface of the gate spacer 140 and the upper surface of the source/drain region SDR. The source/drain contacts described hereinbelow may be disposed so as to penetrate the interlayer insulating film 150, and thus be electrically connected with the source/drain SDR.

Although the description above was about the fourth gate structure G4, the first, second and third gate structures G1, G2, G3 also have the same structure as the fourth gate structure G4.

Referring to FIG. 1 and FIG. 4, the semiconductor device may include, on the cell region CR, first, second, third, fourth, fifth and sixth metal lines M11, M12, M13, M14, M5, M6 which extend in the first direction X and that are spaced apart from one another in the second direction Y. The first, second, third, fourth, fifth and sixth metal lines M11, M12, M13, M14, M5, M6 may each include metal, for example, at least one of copper (Cu), aluminum (Al), gold (Au), silver (Ag), tungsten (W), titanium (Ti), titanium nitride (TiN) and tungsten nitride (WN). However, embodiments are not limited thereto.

The fifth metal line M5 may extend in the first direction X, spaced apart from the first active region AR1 in the second direction Y and disposed on one side of the cell region CR on the first power rail region.

The fifth metal line M5 may only partially overlap the cell region CR, as can be seen from FIG. 1 and FIG. 4. The other part of the fifth metal line M5 that does not overlap the cell region CR may overlap another cell region that is adjacent to the cell region CR. Because of this, the fifth metal line M5 may electrically connect the cell region CR and the adjacent cell region.

The sixth metal line M6 may extend in the first direction X, spaced apart from the second active region AR2 in the second direction Y and disposed on another side of the cell region CR on the second power rail region. The sixth metal line M6 may only partially overlap the cell region CR, as can be seen from FIG. 1 and FIG. 4. The other part of the sixth metal line M6 that do not overlap the cell region CR may overlap another cell region that is adjacent to the cell region CR. Because of this, the sixth metal line M6 may electrically connect the cell region CR and the adjacent cell region.

The first metal line M11 may extend in the first direction X on the first active region AR1, spaced apart from the fifth metal line M5 in the second direction Y. The first metal line M11 may have a second width W1 in the second direction Y.

The second metal line M12 may extend in the first direction X on the separation region STI. A portion of the second metal line M12 may partially overlap the first active region AR1, as illustrated in FIG. 1 and FIG. 4. However, embodiments are not limited thereto. In some embodiments, the second metal line M12 may be disposed only on the separation region STI.

The second metal line M12 may be spaced apart from the first metal line M11 by a first pitch P1 in the second direction Y. The second metal line M12 may have a third width W2 in the second direction Y.

The third metal line M13 may extend in the first direction X on the separation region STI. A portion of the third metal line M13 may partially overlap the second active region AR2, as illustrated in FIG. 1 and FIG. 4. However, embodiments are not limited thereto. In some embodiments, the third metal line M13 may be disposed only on the separation region STI.

The third metal line M13 may be spaced apart from the second metal line M12 by a second pitch P2 in the second direction Y. The third metal line M13 may have a fourth width W3 in the second direction Y.

The fourth metal line M14 may extend in the first direction X on the second active region AR2. The fourth metal line M14 may be spaced apart from the third metal line M13 by a third pitch P3 in the second direction Y, and be spaced apart from the sixth metal line M6 in the second direction Y. The fourth metal line M14 may have a fifth width W4 in the second direction Y.

The second width W1 of the first metal line M11, the third width W2 of the second metal line M12, the fourth width W3 of the third metal line M13, and the fifth width W4 of the fourth metal line M14 may be identical. However, embodiments are not limited thereto. In some embodiments, at least one of the second width W1 of the first metal line M11, the third width W2 of the second metal line M12, the fourth width W3 of the third metal line M13, and the fifth width W4 of the fourth metal line M14 may be different from the rest.

The first pitch P1 between the first metal line M11 and the second metal line M12, the second pitch P2 between the second metal line M12 and the third metal line M13, and the third pitch P3 between the third metal line M13 and the fourth metal line M14 may be identical. However, embodiments are not limited thereto. In some embodiments, at least one of the first pitch P1 between the first metal line M11 and the second metal line M12, the second pitch P2 between the second metal line M12 and the third metal line M13, and the third pitch P3 between the third metal line M13 and the fourth metal line M14 may be different from the rest.

A semiconductor device according to some embodiments of the present disclosure may include the cell region CR defined by the correlation of the first width Hc of the cell region CR in the second direction Y, the width W1, W2, W3, W4 of each of the first, second, third and fourth metal lines M11, M12, M13, M14 in the second direction Y, and the pitches P1, P2, P3 between the first, second, third and fourth metal lines M11, M12, M13, M14 in the second direction Y.

The cell region CR of the semiconductor device according to some embodiments of the present disclosure may be defined, for example, as the case where the first width Hc divided by a sum of the first width W1 and the first pitch P1 is six or less. In this case, a number of metal lines disposed on the cell region CR may be three or four. However, embodiments are not limited thereto. In some embodiments, the number of metal lines disposed on the cell region CR may vary as long as it satisfies the correlation described above.

Referring to FIG. 1 and FIG. 3, the first, second and third source/drain contacts CA1, CA2, CA3 may be spaced apart from one another in the first direction, and be disposed on the first active region AR1. The fourth, fifth and sixth source/drain contacts CA4, CA5, CA6 may be spaced apart from one another in the first direction, and be disposed on the second active region AR2. Although it is illustrated in FIG. 1 and FIG. 3 that the first, second and third source/drain contacts CA1, CA2, CA3 are disposed only on the first active region AR1, and the fourth, fifth and sixth source/drain contacts CA4, CA5, CA6 are disposed only on the second active region AR2, this is just for convenience of explanation, and embodiments are not limited thereto. At least one of the first, second, third, fourth, fifth and sixth source/drain contacts CA1, CA2, CA3, CA4, CA5, CA6 may also be disposed on the separation region STI, and be electrically connected with the second metal line M12 or the third metal line M13. At least one of the first, second, third, fourth, fifth and sixth source/drain contacts CA1, CA2, CA3, CA4, CA5, CA6 may also be disposed on the first power rail region or the second power rail region, and may be electrically connected with the fifth metal line M5 or the sixth metal line M6.

Referring to FIG. 1 and FIG. 3, the first, second and third source/drain contacts CA1, CA2, CA3 may electrically connect the first active region AR1 and the first metal line M11. The fourth, fifth and sixth source/drain contacts CA4, CA5, CA6 may electrically connect the second active region AR2 and the fourth metal line M14.

At least a portion of the first gate contact CB11 may overlap the separation region STI. In some embodiments, the first gate contact CB11 may overlap only the separation region STI. An edge of the first gate contact CB11 that is adjacent to the first active region AR1 may be disposed on a boundary B1 between the first active region AR1 and the separation region STI. However, embodiments are not limited thereto. In some embodiments, a portion of the first gate contact CB11 may overlap the first active region AR1. The first gate contact CB11 may electrically connect the third gate structure G3 and the second metal line M12.

At least a portion of the second gate contact CB12 may overlap the separation region STI. In some embodiments, the second gate contact CB12 may overlap only the separation region STI. That is, an edge of the second gate contact CB12, that is adjacent to the second active region AR2, may be disposed on a boundary B2 between the second active region AR2 and the separation region STI. However, embodiments are not limited thereto. In some embodiments, a portion of the second gate contact CB12 may overlap the second active region AR2. The second gate contact CB12 may electrically connect the second gate structure G2 and the third metal line M13.

The first, second, third, fourth, fifth and sixth source/drain contacts CA1, CA2, CA3, CA4, CA5, CA6 and the first and second gate contacts CB11, CB12 may include a conductive material, for example, W, Al, Cu or the like, but embodiments are not limited thereto.

In a semiconductor device according to some embodiments of the present disclosure, it is possible to dispose each of at least a portion of the first gate contact CB1 land at least a portion of the second gate contact CB12 on the separation region STI, thereby effectively separating between the first and second gate contacts CB11, CB12 and the first, second, third, fourth, fifth and sixth source/drain contacts CA1, CA2, CA3, CA4, CA5, CA6 from each other. By avoiding placing the first and second gate contacts CB11, CB12 adjacent to the first, second, third, fourth, fifth and sixth source/drain contacts CA1, CA2, CA3, CA4, CA5, CA6, it is possible to reduce the level of difficulty of the process for separating the source/drain contact and the gate contact from each other.

Hereinbelow, a semiconductor device according to further embodiments of the present disclosure will be described with reference to FIG. 7. The description will focus on the differences from the semiconductor device illustrated in FIG. 1.

Figure 7:
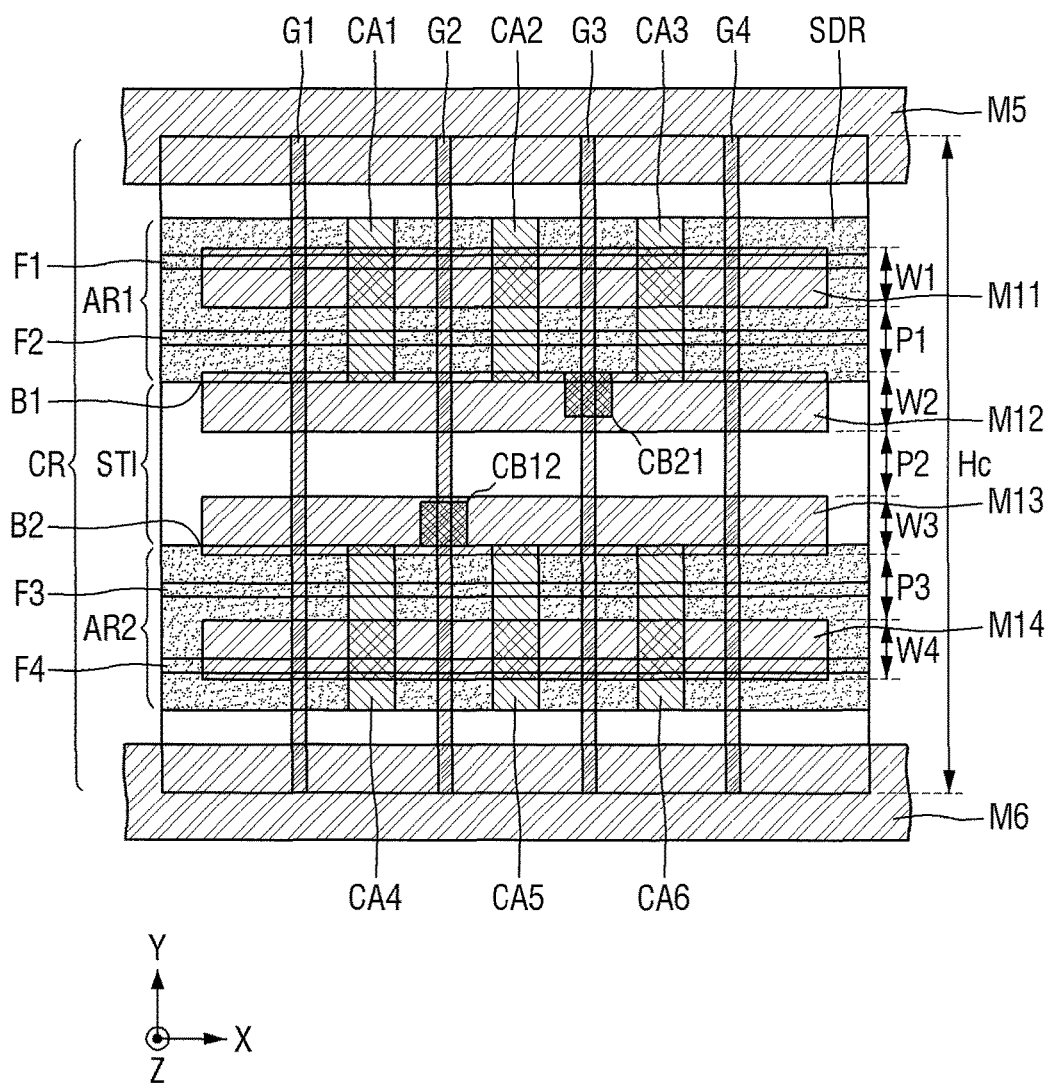
FIG. 7 is a layout diagram of a semiconductor device according to further embodiments of the present disclosure.

FIG. 7 is a layout diagram of a semiconductor device according to further embodiments of the present disclosure. Referring to FIG. 7, a portion of a first gate contact CB21 overlaps a first active region AR1, and a second gate contact CB12 overlaps only a separation region STI. In this case, it is possible to effectively separate the first gate contact CB21, a second source/drain contact CA2 and a third source/drain CA3 from each other, thereby reducing the level of difficulty of the fabrication process. Unlike the embodiment illustrated in FIG. 7, in some embodiments, a portion of the second gate contact CB12 may overlap the second active region AR2, and the first gate contact CB21 may overlap only the separation region STI.

Hereinbelow, a semiconductor device according to still further embodiments of the present disclosure will be described with reference to FIG. 8. The description will focus on the differences from the semiconductor device illustrated in FIG. 1.

Figure 8:
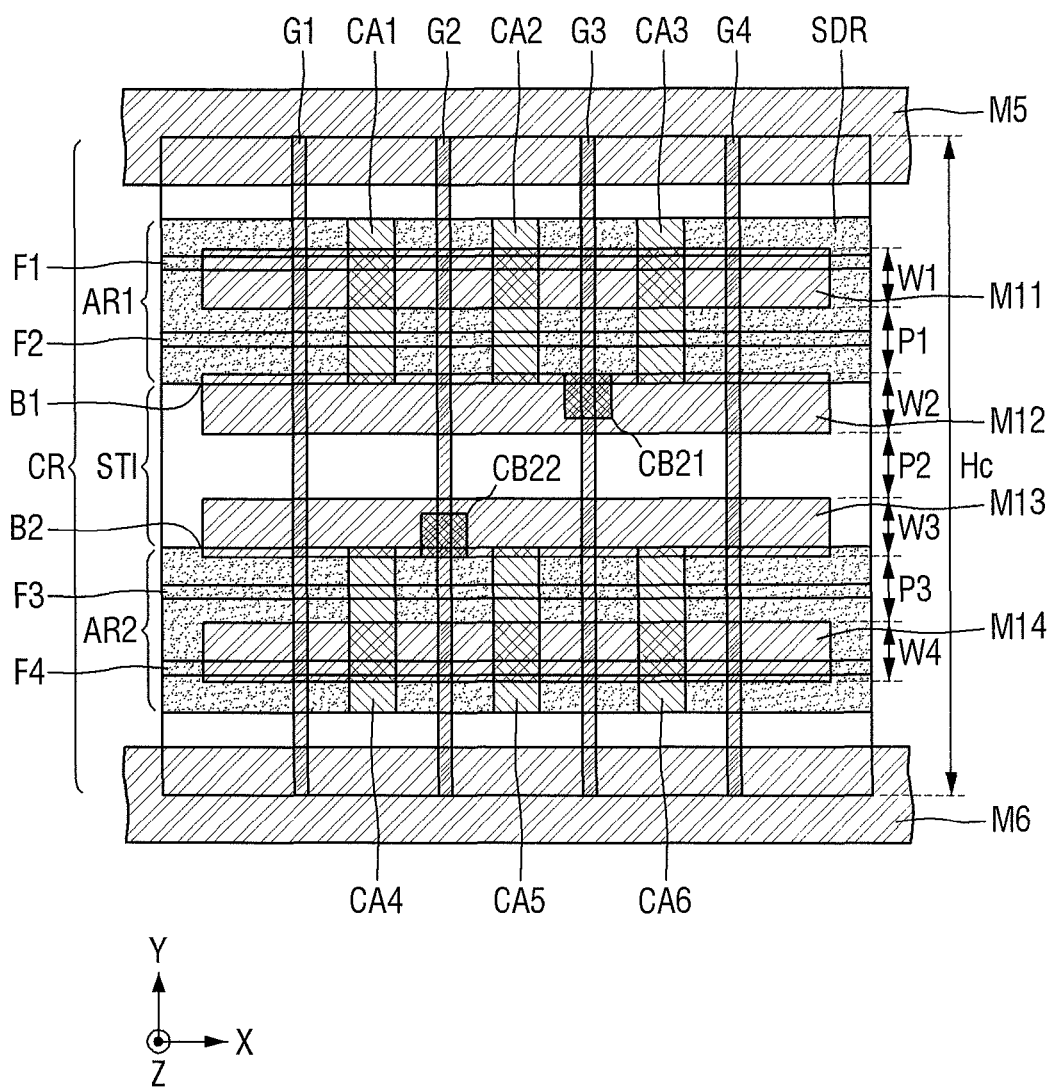
FIG. 8 is a layout diagram of a semiconductor device according to still further embodiments of the present disclosure.

FIG. 8 is a layout diagram of the semiconductor device according to still further embodiments of the present disclosure. Referring to FIG. 8, a portion of a first gate contact CB21 overlaps a first active region AR1, and a portion of a second gate contact CB22 overlaps a second active region AR2. In this case, it is possible to effectively separate the first gate contact CB21, a second source/drain contact CA2 and a third source/drain CA3 from each other, and the second gate contact CB22, and a fourth source/drain contact CA4 and a fifth source/drain contact CA5 from each other, thereby reducing the level of difficulty of the process.

Hereinbelow, a semiconductor device according to still further embodiments of the present disclosure will be described with reference to FIG. 9. The description will focus on the differences from the semiconductor device illustrated in FIG. 1.

Figure 9:
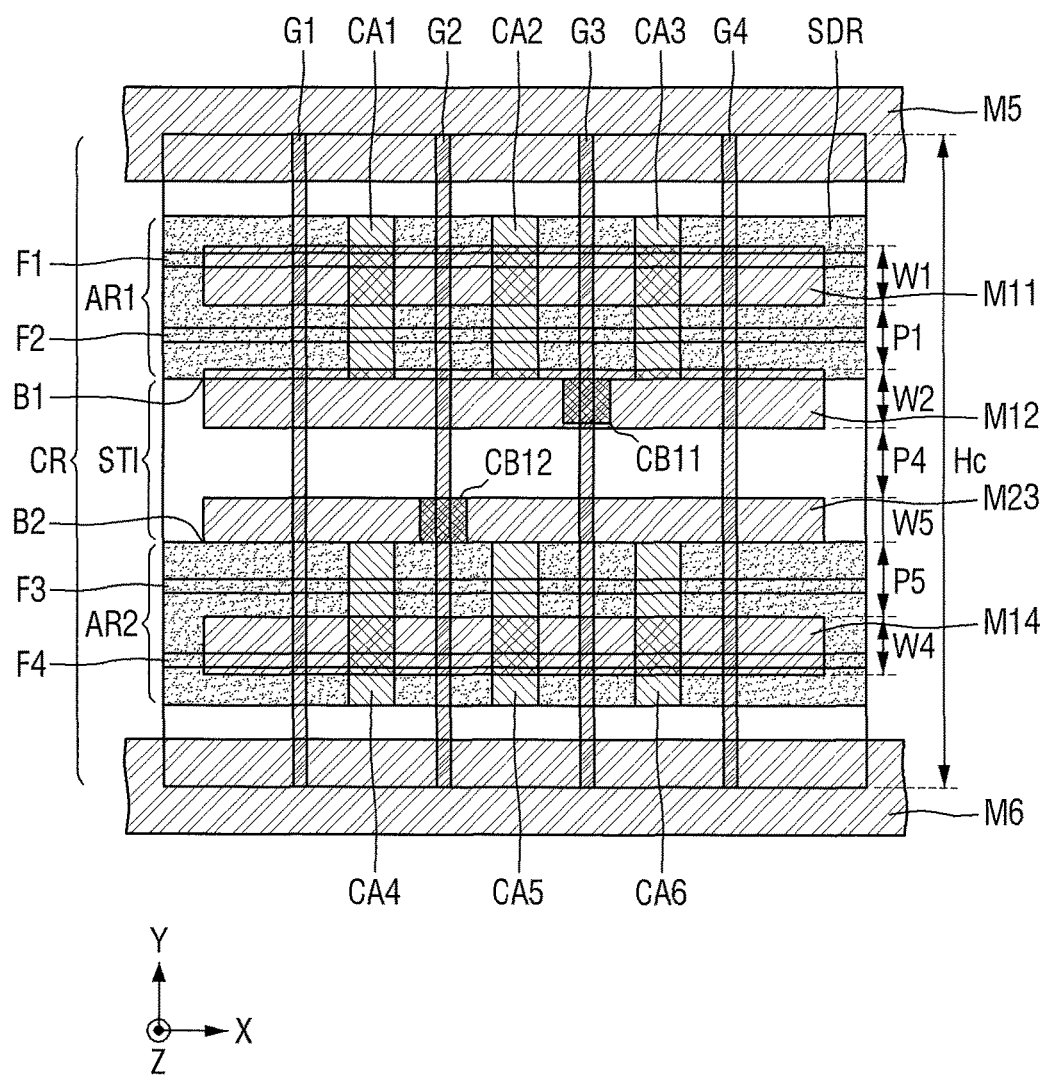
FIG. 9 is a layout diagram of a semiconductor device according to still further embodiments.

FIG. 9 is a layout diagram of the semiconductor device according to still further embodiments of the present disclosure. Referring to FIG. 9, the width of at least one the first, second, third and fourth metal lines in the second direction Y is different from the width of the rest of the metal lines in the second direction Y. At least one of the pitches between the first, second, third and fourth metal lines in the second direction Y is different from the pitch between the rest of the metal lines in the second direction Y.

For example, referring to FIG. 9, the sixth width W5 of a third metal line M23 in the second direction Y is smaller than each of widths W1, W2, W4 of first, second and fourth metal lines M11, M12, M14. Each of the fourth pitch P4 between the second metal line M12 and a third metal line M23 in the second direction Y, and of the fifth pitch P5 between the third metal line M23 and the fourth metal line M14 in the second direction Y, is greater than the first pitch P1. However, this is just an example and, in some embodiments, unlike the illustration in FIG. 9, a sixth width W5 of the third metal line M23 in the second direction Y may be greater than each of the widths W1, W2, W4 of the other metal lines M11, M12, M14. In some embodiments, the width of the metal line other than the third metal line M23, in the second direction Y, may be different from the width of the rest of the metal lines, in the second direction Y.

Hereinbelow, a semiconductor device according to still further embodiments of the present disclosure will be described with reference to FIG. 10. The description will focus on the differences from the semiconductor device illustrated in FIG. 1.

Figure 10:
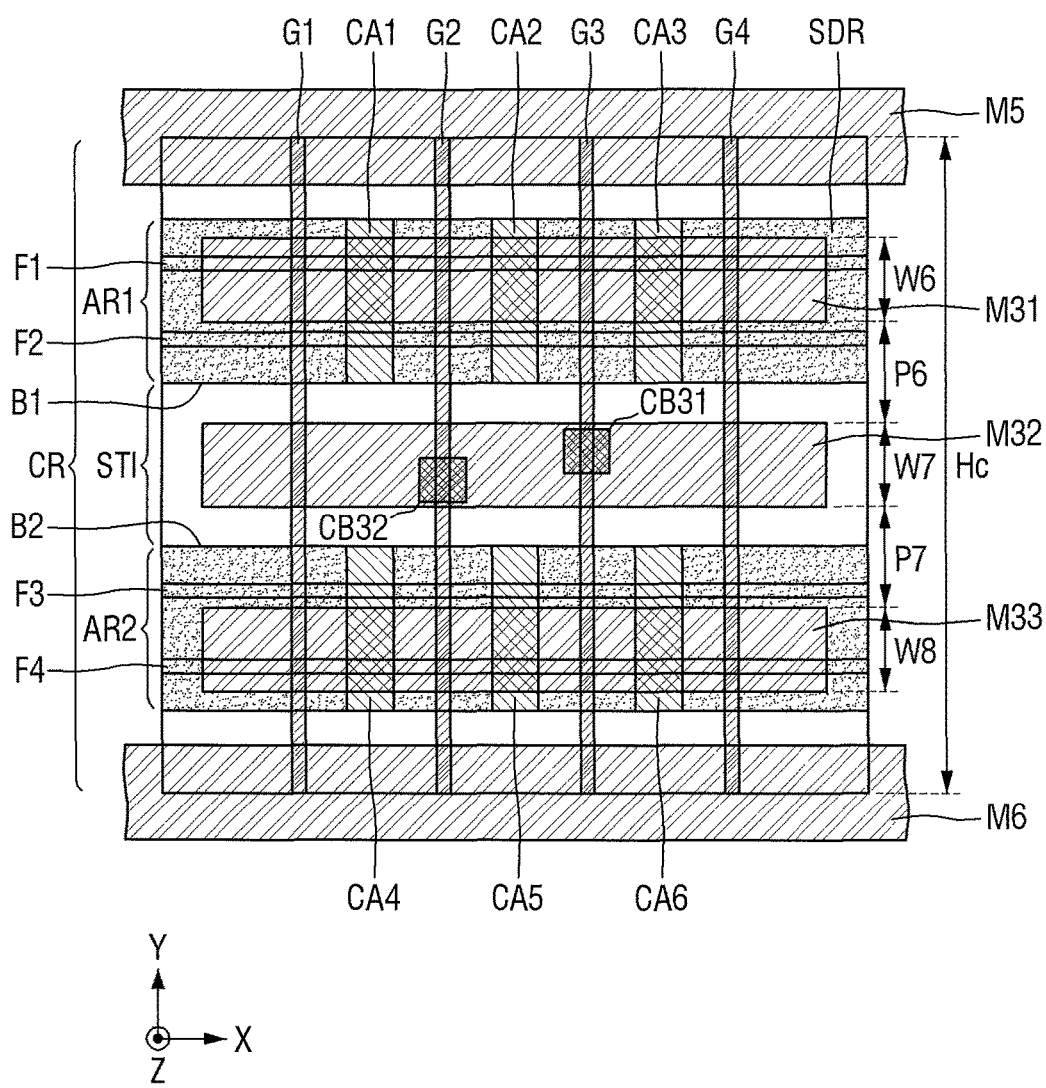
FIG. 10 is a layout diagram of a semiconductor device according to still further embodiments.

FIG. 10 is a layout diagram of the semiconductor device according to still further embodiments of the present disclosure. Referring to FIG. 10, on a first active region AR1, a separation region STI and a second active region AR2, three metal lines are disposed. A first metal line M31 is disposed on the first active region AR1, a second metal line M32 is disposed on the separation region STI, and a third metal line M33 is disposed on the second active region AR2. In this case, the first metal line M31 has a seventh width W6, the second metal line M32 has an eighth width W7, the third metal line M33 has a ninth width W8. The seventh to ninth widths W6, W7, W8 may be identical, but embodiments are not limited thereto. In some embodiments, any one of the seventh to ninth widths W6, W7, W8 may be different from the rest of the widths. A sixth pitch P6 between the first metal line M31 and the second metal line M32, in the second direction Y may be identical to a seventh pitch P7 between the second metal line M32 and the third metal line M33, in the second direction Y. A first gate contact CB31 electrically connects a third gate structure G3 and the second metal line M32, and a second gate contact CB32 electrically connects a second gate structure G2 and the second metal line M32.

Hereinbelow, a semiconductor device according to still further embodiments of the present disclosure will be described with reference to FIG. 11 and FIG. 12. The description will focus on the differences from the semiconductor device illustrated in FIG. 1.

Figure 11:
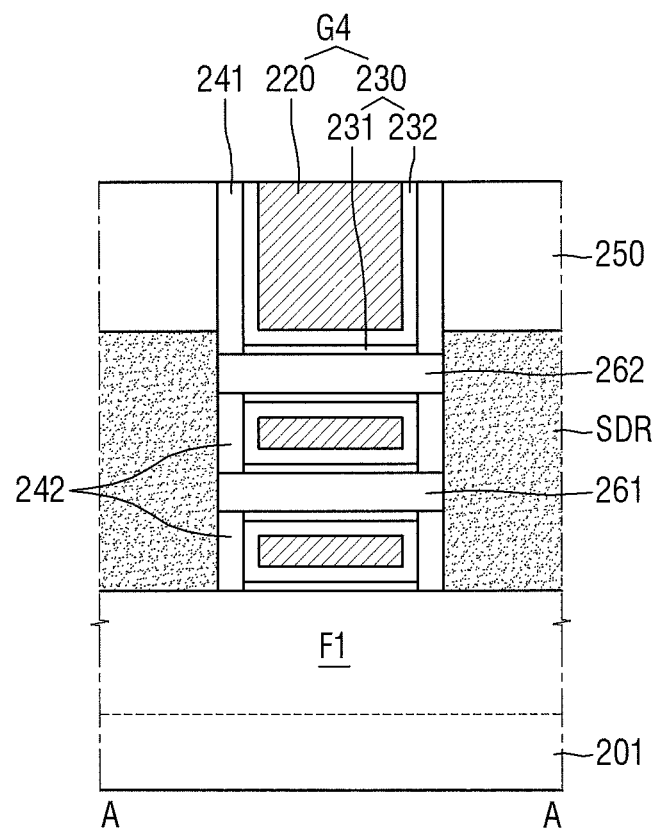
FIG. 11 and FIG. 12 are cross-sectional views of a semiconductor device according to still further embodiments.
Figure 12:
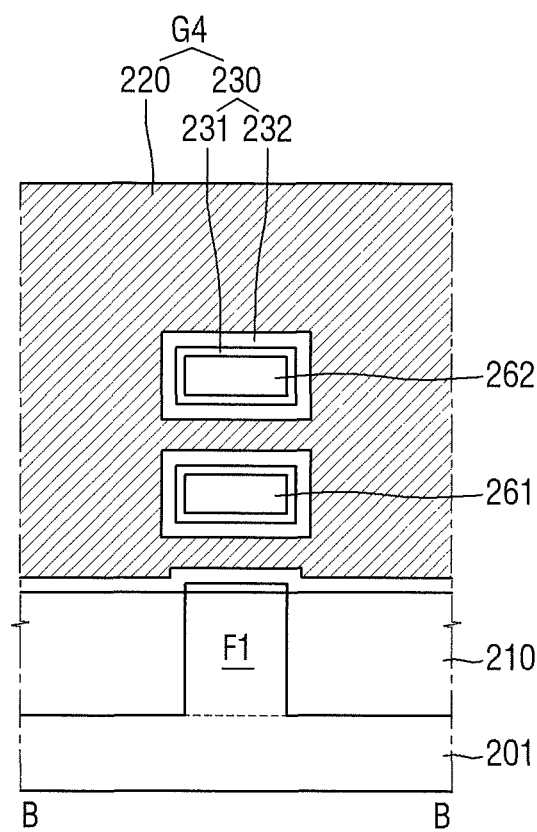

Referring to FIG. 11 and FIG. 12, a semiconductor device includes a plurality of nanowires where each of the gate structures is stacked vertically. For example, a fourth gate structure G4 may include a gate insulating film 230, a gate electrode 220, a first nanowire 261 and a second nanowire 262. In the fourth gate structure G4, the first nanowire 261 is stacked on a substrate 201, and the second nanowire 262 is stacked on the first nanowire 261. Although it is illustrated in FIG. 11 and FIG. 12 that two nanowires 261, 262 are stacked, embodiments are not limited thereto. In some embodiments, on a first fin-type pattern F1 of the substrate 201, one or three or more nanowires may be stacked.

The first nanowire 261 may extend in the first direction X on the substrate 201, and may be spaced apart from the substrate 201. Specifically, the first nanowire 261 may be spaced apart from the first fin-type pattern F1. The first nanowire 261 may overlap the first fin-type pattern F1. The first nanowire 261 may not be disposed on a field insulating film 210 but on the first fin-type pattern F1.

The second nanowire 262 may extend in the first direction X on the first nanowire 261, and may be spaced apart from the first nanowire 261. The second nanowire 262 may overlap the first fin-type pattern F1. The second nanowire 262 may not be disposed on the field insulating film 210 but on the first fin-type pattern F1.

The gate electrode 220 may be disposed on the field insulating film 210 and on the first fin-type pattern F1. The gate electrode 220 may extend in the second direction Y. The gate electrode 220 may surround a periphery of the first nanowire 261 that is spaced apart from the upper surface of the first fin-type pattern F1. The gate electrode 220 may also be disposed in a space defined between the first nanowire 261 and the first fin-type pattern F1. The gate electrode 220 may surround the periphery of the second nanowire 262. The gate electrode 220 may also be formed in a space defined between the first nanowire 261 and the second nanowire 262.

Outer spacers 241 may be disposed on side walls of the gate electrode 220 that extends in the second direction Y. Inner spacers 242 may be disposed on both sides of the first nanowire 261 so as to face each other. The inner spacers 242 may be disposed on both sides of the second nanowire 262 so as to face each other. The inner spacers 242 may be disposed between the upper surface of the first fin-type pattern F1 and the first nanowire 261, and between the first nanowire 261 and the second nanowire 262. The inner spacers 242 may be surrounded by the first nanowire 261, the second nanowire 262, the first fin-type pattern F1 and the outer spacer 241. The inner spacer s242 may be disposed between the upper surface of the first fin-type pattern F1 and the first nanowire 261, and between the first nanowire 261 and the second nanowire 262.

The outer spacer 241 may include, for example, silicon nitride (SiN), silicon oxynitride (SiON), silicon oxide (SiO2), and silicon oxycarbonitride (SiOCN), or a combination thereof. For example, the inner spacer 242 may include, for example, a low-k dielectric material, silicon nitride (SiN), silicon oxynitride (SiON), silicon oxide (SiO2), silicon oxycarbidenitride (SiOCN), or a combination thereof. The low-k dielectric material may be a material that has a smaller dielectric constant than silicon oxide.

The gate insulating film 230 may be disposed between the first nanowire 261 and the gate electrode 220, and between the second nanowire 262 and the gate electrode 220. The gate insulating film 230 may be disposed along the periphery of the second nanowire 262. The gate insulating film 230 may also be disposed between the field insulating film 210 and the gate electrode 220, between the first fin-type pattern F1 and the gate electrode 220, between the outer spacers 241 and the gate electrode 220, and between the inner spacers 242 and the gate electrode 220.

The gate insulating film 230 may include, for example, an interfacial film 231 and the high-k dielectric insulating film 232, as illustrated in FIG. 11 and FIG. 12. However, embodiments are not limited thereto. In some embodiments, the interfacial film 231 may be omitted.

Since the interfacial film 231 may be formed along the periphery of the first nanowire 261, it may be disposed between the first nanowire 261 and the gate electrode 220, and between the first fin-type pattern F1 and the gate electrode 220. The high-k dielectric insulating film 232 may be disposed between the first nanowire 261 and the gate electrode 220, between the first fin-type pattern F1 and the gate electrode 220, between the field insulating film 210 and the gate electrode 220, between the outer spacer 241 and the gate electrode 220, and between the inner spacer 242 and the gate electrode 220. An interlayer insulating film 250 may overlie the side surfaces of the outer spacers 241 and the upper surface of the source/drain region SDR.

Although the exemplary embodiments of the present disclosure were described above with reference to the accompanying drawings, embodiments are not limited to those embodiments, but may be manufactured in various different forms, and it will be understood that a person skilled in the technical field that the present disclosure belongs to will be able implement the present disclosure in different specific forms without changing the technical concept or the features of the present disclosure. Accordingly, it will be understood that the embodiments described above are only illustrative, and should not be construed as limiting.

What is claimed is:

1. A semiconductor device comprising:
    a cell region that includes a first active region and a second active region extending in a first direction, and a separation region between the first active region and the second active region, the cell region having a first width in a second direction perpendicular to the first direction;
    a first gate structure and a second gate structure on the cell region, spaced apart from each other in the first direction, and extending in the second direction;
    a first metal line and a second metal line on the cell region, extending in the first direction, spaced apart from each other by a first pitch in the second direction, and each at least partially overlapping the separation region, each of the first and second metal line having a second width in the second direction;
    a first gate contact electrically connecting the first gate structure and the first metal line, at least a portion of the first gate contact overlapping the separation region; and
    a second gate contact electrically connecting the second gate structure and the second metal line, at least a portion of the second gate contact overlapping the separation region, wherein the first width divided by a sum of the first pitch and the second width is six or less,
    wherein an edge of the second gate contact is disposed on a boundary between the second active region and the separation region.

2. The semiconductor device of claim 1, wherein the first gate contact and the second gate contact are disposed only on the separation region.

3. The semiconductor device of claim 2, wherein an edge of the first gate contact is disposed on a boundary between the first active region and the separation region.

4. The semiconductor device of claim 1, wherein a portion of the first gate contact overlaps the first active region.

5. The semiconductor device of claim 1, further comprising:
    wherein the first active region comprises a first fin-type pattern extending in the first direction and protruding from a substrate; and
    wherein the second active region comprises a second fin-type pattern extending in the first direction and protruding from the substrate.

6. The semiconductor device of claim 1, wherein the first gate structure comprises:
    a first nanowire extending in the first direction;
    a second nanowire extending in the first direction, disposed on the first nanowire and spaced apart from the first nanowire; and
    a gate electrode surrounding the first and second nanowires.

7. The semiconductor device of claim 1, wherein at least a portion of the first metal line and at least a portion of the second metal line overlap the separation region.

8. The semiconductor device of claim 1, further comprising:
    on the first active region, a third metal line extending in the first direction and spaced apart from the first metal line by a second pitch in the second direction; and
    on the second active region, a fourth metal line extending in the first direction and spaced apart from the second metal line by a third pitch in the second direction,
    wherein the first, second and third pitches are substantially the same and the first metal line and the second metal line are disposed only on the separation region.

9. A semiconductor device comprising:
    a cell region that includes a first active region, a second active region and a separation region between the first active region and the second active region;
    a plurality of metal lines on the cell region, extending in a first direction, and spaced apart from one another in a second direction perpendicular to the first direction;
    a gate structure transverse to the plurality of metal lines and extending in the second direction; and
    a gate contact that at least partially overlaps the separation region and that electrically connects at least one of the plurality of metal lines and the gate structure,
    wherein a number of the plurality of metal lines spaced apart from one another in the second direction on the first active region, the separation region and the second active region is three or four and
    wherein an edge of gate contact is disposed on a boundary between the second active region and the separation region.

10. The semiconductor device of claim 9, wherein the plurality of metal lines are spaced apart from one another in the second direction by a first pitch.

11. The semiconductor device of claim 10, wherein the cell region has a first width in the second direction, wherein each of the plurality of metal lines has a second width in the second direction, and wherein the first width divided by a sum of the second width and the first pitch is six or less.

12. The semiconductor device of claim 9:
    wherein the first active region comprises a first fin-type pattern extending in the first direction and protruding from a substrate, and
    wherein the second active region comprises a second fin-type pattern extending in the first direction and protruding from the substrate.

13. The semiconductor device of claim 9, wherein the gate structure comprises:
    a first nanowire extending in the first direction;
    a second nanowire extending in the first direction, disposed on the first nanowire and spaced apart from the first nanowire; and
    a gate electrode surrounding the first and second nanowires.

14. The semiconductor device of claim 9, further comprising:
- a first source/drain contact electrically connecting the first active region and a first one of the plurality of metal lines; and
- a second source/drain contact electrically connecting the second active region and a second one of the plurality of metal lines.

15. A semiconductor device comprising:
- a cell region that includes a first active region and a second active region extending in a first direction and a separation region formed between the first active region and the second active region, the cell region having a first width in a second direction perpendicular to the first direction;
- a first gate structure and a second gate structure on the cell region spaced apart from each other in the first direction and extending in the second direction;
- a first metal line that overlaps the first active region, extends in the first direction, and has a second width in the second direction;
- a second metal line that at least partially overlaps the separation region, that is spaced apart from the first metal line by a first pitch in the second direction, and that extends in the first direction;
- a third metal line that at least partially overlaps the separation region, that is spaced apart from the second metal line by a second pitch in the second direction, and that extends in the first direction;
- a fourth metal line that overlaps the second active region, that is spaced apart from the third metal line by a third pitch in the second direction, and that extends in the first direction;
- a first gate contact electrically connecting the first gate structure and the second metal line; and
- a second gate contact electrically connecting the second gate structure and the third metal line,
- wherein the first, second and third pitches are substantially the same and wherein the first width divided by a sum of the first pitch and the second width is six or less, and
- wherein an edge of the second gate contact is disposed on a boundary between the second active region and the separation region.

16. The semiconductor device of claim 15, wherein at least a portion of the first gate contact and at least a portion of the second gate contact overlap the separation region.

17. The semiconductor device of claim 15, further comprising:
- a first source/drain contact electrically connecting the first active region and the first metal line; and
- a second source/drain contact electrically connecting the second active region and the fourth metal line.

18. The semiconductor device of claim 15, wherein each of the first, second, third and fourth metal lines has the second width in the second direction.

19. The semiconductor device of claim 15, wherein a width of at least one of the second, third and fourth metal lines in the second direction is different from the second width.

* * * * *